(12) United States Patent
Kuo

(10) Patent No.: US 8,534,637 B2
(45) Date of Patent: Sep. 17, 2013

(54) MOUNTING APPARATUS AND MOUNTING APPARATUS ASSEMBLY

(75) Inventor: Szu-Wei Kuo, Tu-Cheng (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 260 days.

(21) Appl. No.: 13/071,464

(22) Filed: Mar. 24, 2011

(65) Prior Publication Data

US 2012/0217361 A1    Aug. 30, 2012

(30) Foreign Application Priority Data

Feb. 24, 2011    (TW) .............................. 100106179 A

(51) Int. Cl.
*A47B 97/00*    (2006.01)

(52) U.S. Cl.
USPC ............................ 248/500; 248/509; 361/760

(58) Field of Classification Search
USPC ................. 439/81, 66, 62, 630, 83; 248/500, 248/509; 24/456; 361/777, 759, 760; 411/552
See application file for complete search history.

(56) References Cited

U.S. PATENT DOCUMENTS

| | | | | |
|---|---|---|---|---|
| 2,936,439 | A * | 5/1960 | Murphy | 439/635 |
| 3,188,598 | A * | 6/1965 | Pferd | 439/59 |
| 3,781,497 | A * | 12/1973 | Stephenson et al. | 200/61.58 B |
| 4,684,194 | A * | 8/1987 | Jenkins et al. | 439/260 |
| 4,801,232 | A * | 1/1989 | Hempel | 411/552 |
| 4,846,730 | A * | 7/1989 | Owen | 439/260 |
| 4,887,969 | A * | 12/1989 | Abe | 439/73 |
| 7,585,188 | B2 * | 9/2009 | Regnier | 439/637 |

* cited by examiner

*Primary Examiner* — Amy J Sterling
(74) *Attorney, Agent, or Firm* — Altis Law Group, Inc.

(57) ABSTRACT

A mounting apparatus seats a card on an element. The mounting apparatus includes a fastening member mounted on the receiving element, a latching member extending through the fastening member to be mounted to the element, and an elastic member fitting about the latching member. Opposite ends of the elastic member resist the latching member and the element. One end of the card is received in the fastening member and clamped between the latching member and the fastening member.

17 Claims, 3 Drawing Sheets

MOUNTING APPARATUS AND MOUNTING APPARATUS ASSEMBLY

BACKGROUND

1. Technical Field

The present disclosure relates to a mounting apparatus for a card, and a mounting apparatus assembly.

2. Description of Related Art

When a computer system is dismantled for cleaning maintenance, or repair, component electronic devices thereof are often disassembled. However, components such as expansion cards for the electronic devices are often fastened in the electronic device by bolts, affecting convenience of assembly or disassembly of the electronic device.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The present disclosure, including the accompanying drawings, is illustrated by way of examples and not by way of limitation. It should be noted that references to "an" or "one" embodiment in this disclosure are not necessarily to the same embodiment, and such references mean at least one.

Figure 1:
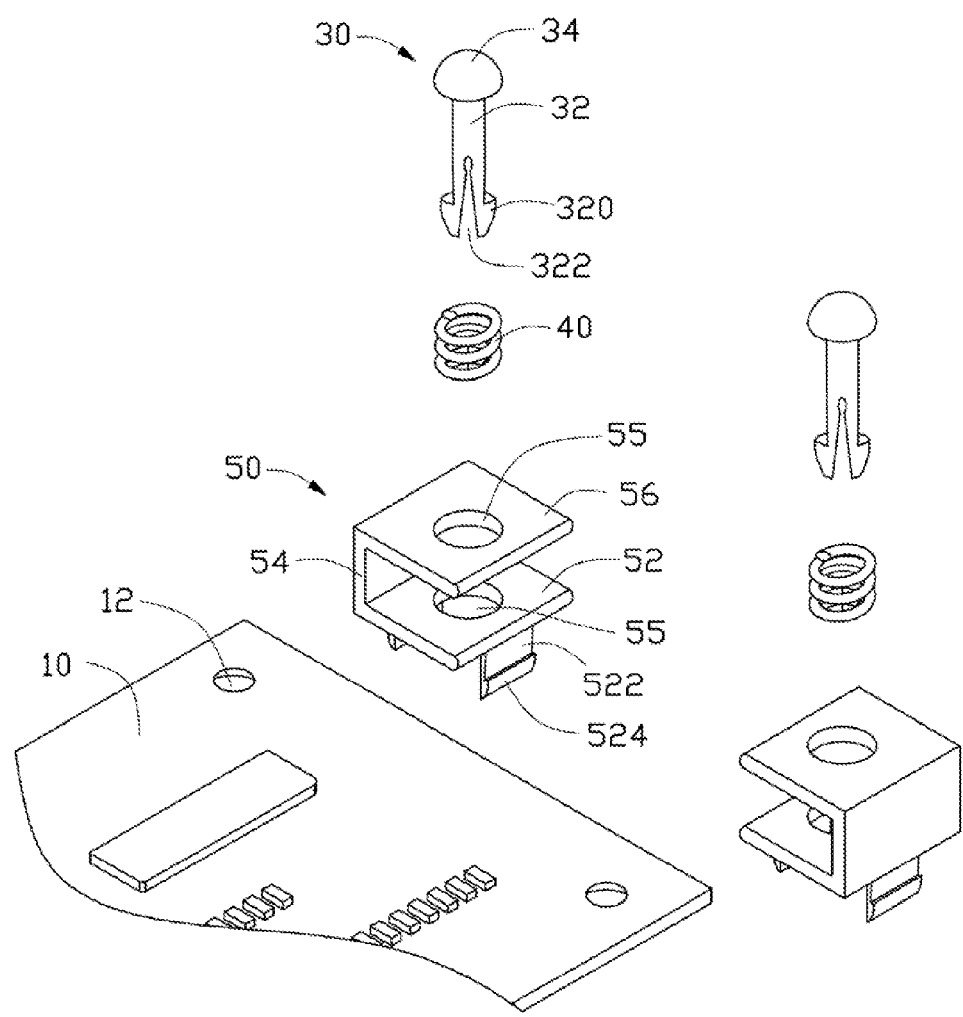
FIG. 1 is an exploded isometric view of an exemplary embodiment of a card mounting apparatus seating an expansion card.
Figure 2:
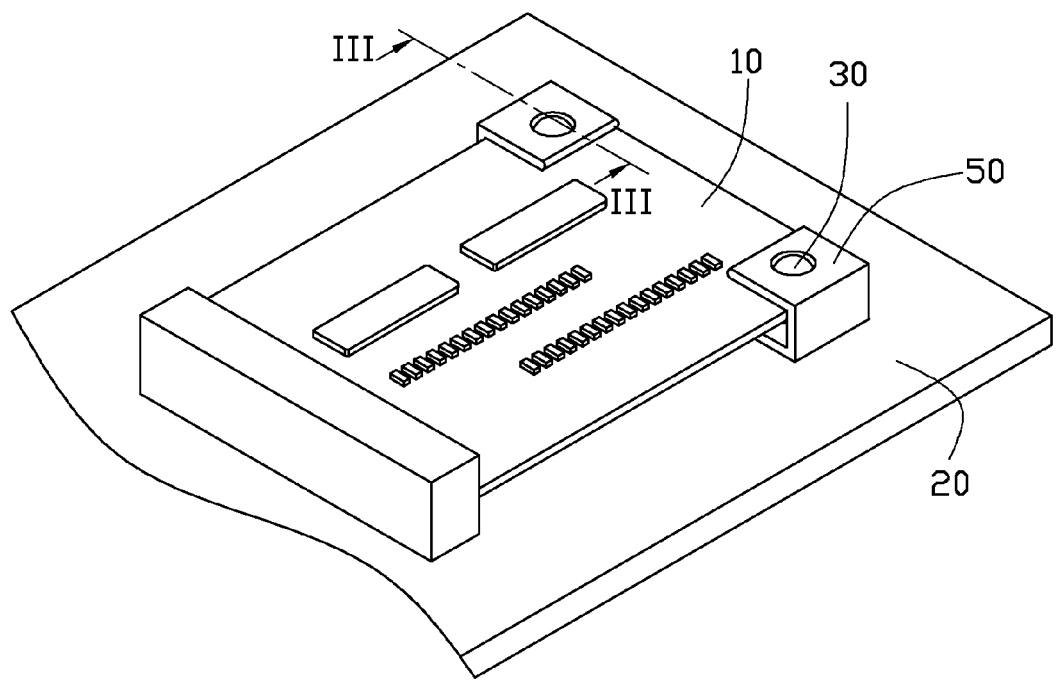
FIG. 2 is an assembled, isometric view of FIG. 1 and a circuit board.
Figure 3:
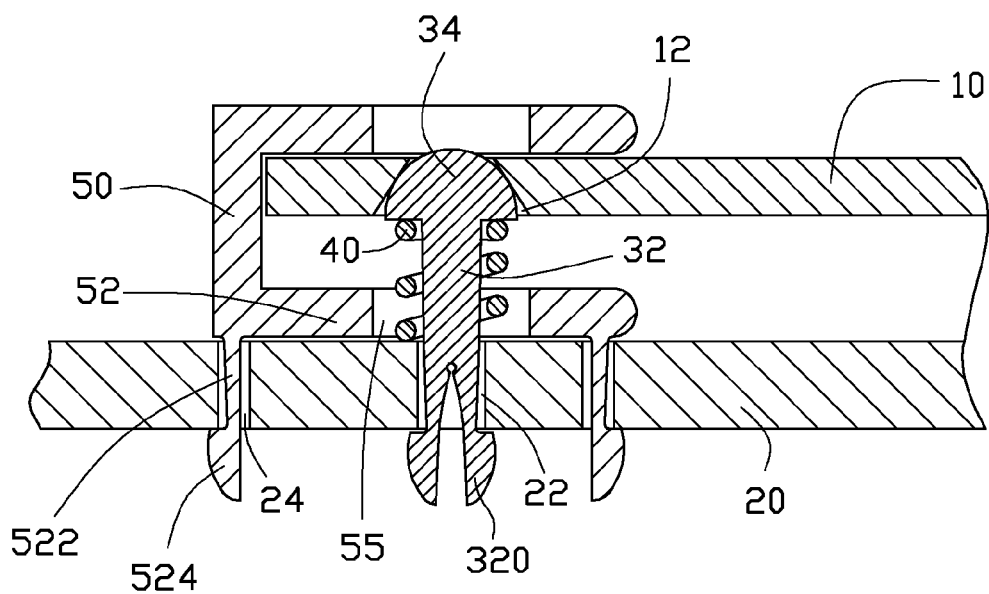
FIG. 3 is a partial, cross-section view of FIG. 2, taken along the line of III-III.

Referring to FIGS. 1 to 3, as disclosed, a mounting apparatus seats a component such as an expansion card 10 on a circuit board 20. A first end of the expansion card 10 is electrically connected to the circuit board 20. A second end of the expansion card 10 opposite to the first end defines a positioning hole 12. An exemplary embodiment of the mounting apparatus includes a latching member 30, an elastic member 40, and a fastening member 50.

The latching member 30 includes a substantially cylindrical post 32. Two opposite protrusions 320 extend from a circumference of a first end of the post 32. The first end of the post 32 axially defines a cutout 322. A substantially hemispherical flange 34 extends from a second end of the post 32, opposite the first end. A diameter of the flange 34 exceeds a diameter of the positioning hole 12.

In this embodiment, the elastic member 40 is a spring.

The fastening member 50 is substantially U-shaped, and includes a bottom plate 52, a top plate 56 opposite to the bottom plate 52, and a connection plate 54 between corresponding sides of the bottom plate 52 and the top plate 56. The bottom plate 52 and the top plate 56 each define a through hole 55, aligned with each other. A diameter of each through hole 55 exceeds the diameter of the flange 34. Two opposite elastic latching pieces 522 depend from a bottom surface of the bottom plate 52, at opposite sides of the through hole 55. A substantially wedge-shaped latch 524 extends from a distal end of each latching piece 522, opposite to the other latching piece 522.

The circuit board 20 defines a fastening hole 22 and two latching holes 24 at opposite sides of the fastening hole 22.

During assembly, the latching pieces 522 of the fastening member 50 extend through the latching holes 24 of the circuit board 20, respectively. The through holes 55 of the fastening member 50 align with the fastening hole 22. The bottom surface of the bottom plate 52 resists a top of the circuit board 20. The latches 524 of the fastening member 50 are latched to a bottom of the circuit board 20. Thereby, the fastening member 50 is fastened to the circuit board 20. The elastic member 40 fits about the post 32 of the latching member 30. The post 32 with the elastic member 40 extends through the through hole 55 of the top plate 56, and the through hole 55 of the bottom plate 52. The distal end of the post 32 extends through the fastening hole 22 of the circuit board 20. Opposite ends of elastic member 40 resist the flange 34 of the latching member 30 and the top of the circuit board 20. The protrusions 320 of the latching member 30 are latched to the bottom of the circuit board 20, whereby the latching member 30 is fastened to the circuit board 20. In this embodiment, the cutout 322 of each latching member 30 is provided to conveniently deform the distal end of the post 32.

In use, the second end of the expansion card 10 is inserted into the fastening member 50, between the top and bottom plates 56 and 54 of the fastening member 50. The expansion card 10 resists the flange 322 of the latching member 30. The latching member 30 is moved down to deform the elastic member 40. The elastic member 40 is restored to bias the top of the flange 322 to be received in the positioning hole 12 of the expansion card 12, when the expansion card 10 moves to a position where the positioning hole 12 aligns with the flange 322. Therefore, the latching member 30 presses the expansion card 10 to resist the top plate 56 and the expansion card 10 is fastened to the circuit board 20.

For removal of the expansion card 10, the top of the flange 322 of the latching member 30 is pressed to deform the elastic member 40, by a tool extending through the through hole 55 of the top plate 56 of the fastening member 50. The flange 322 withdraws from the positioning hole 12 of the expansion card 10, which is then readily removed from the fastening member 50.

It is to be understood, however, that even though numerous characteristics and advantages of the embodiments have been set forth in the foregoing description, together with details of the structure and function of the embodiments, the present disclosure is illustrative only, and changes may be made in details, especially in matters of shape, size, and arrangement of parts within the principles of the embodiments to the full extent indicated by the broad general meaning of the terms in which the appended claims are expressed.

The invention claimed is:

1. A mounting apparatus for seating a card on an element, the mounting apparatus comprising:

a fastening member to be mounted to the element;

a latching member extending through the fastening member to be latched to the element; and an elastic member connected between the latching member and the element, wherein opposite ends of the elastic member resist the latching member and the element, to bias the latching member to move for sandwiching the card between the latching member and the fastening member thereby mounting the card to the element; the fastening member is substantially U-shaped and comprises a top plate, a bottom plate opposite to the top plate, and a connection plate substantially perpendicularly connected between corresponding sides of the top and bottom plates, and two elastic latching pieces extend from a bottom surface of the bottom plate to extend through the element to be latched to the element.

2. The mounting apparatus of claim 1, wherein a latch extends from each latching piece opposite to the other latching piece, to be latched to a bottom of the element opposite to the bottom plate.

3. The mounting apparatus of claim 2, wherein the latch is substantially wedge-shaped.

4. The mounting apparatus of claim 1, wherein the bottom plate and the top plate each define a through hole through which the latching member extends.

5. The mounting apparatus of claim 4, wherein the through holes of the top plate and the bottom plate align with each other.

6. The mounting apparatus of claim 1, wherein the latching member comprises a post, two protrusions extend from a circumference of a first end of the post to be latched to a bottom of the element.

7. The mounting apparatus of claim 6, wherein a flange extends from a second end of the post opposite to the first end, a corresponding end of the elastic member resists the flange.

8. The mounting apparatus of claim 7, wherein the elastic member is a spring.

9. A mounting apparatus assembly set on an element, the mounting apparatus assembly comprising:
   a fastening member mounted to the element and comprising a top plate, wherein the top plate defines a through hole;
   a latching member comprising a post, and a flange extending from one end of the post, wherein the post extends through the fastening member to be latched to the element;
   a card sandwiched between the latching member and the top plate of the fastening member, and defining a positioning hole, wherein the flange of the latching member partially extending through the positioning hole and exploded in the through hole of the top plate; and
   an elastic member connected between the latching member and the element, wherein opposite ends of the elastic member resist the flange of the latching member and the element, to bias the latching member to move to sandwich the card between the latching member and the fastening member.

10. The mounting apparatus assembly of claim 9, wherein the fastening member is substantially U-shaped and comprises a bottom plate opposite to the top plate, and a connection plate substantially perpendicularly connected between corresponding sides of the top and bottom plates, two elastic latching pieces extend from a bottom surface of the bottom plate to extend through the element to be latched to the element.

11. The mounting apparatus assembly of claim 10, wherein a latch extends from each latching piece opposite to the other latching piece, to be latched to a bottom of the element opposite to the bottom plate.

12. The mounting apparatus assembly of claim 11, wherein the latch is substantially wedge-shaped.

13. The mounting apparatus assembly of claim 10, wherein the bottom plate defines a through hole through which the post of the latching member extends.

14. The mounting apparatus assembly of claim 13, wherein the through holes of the top plate and the bottom plate align with each other.

15. The mounting apparatus assembly of claim 10, wherein two protrusions extend from a circumference of the other end of the post to be latched to a bottom of the element.

16. The mounting apparatus assembly of claim 9, wherein the elastic member is a spring.

17. The mounting apparatus assembly of claim 9, wherein the flange is the substantially hemispherical, a diameter of the flange exceeds a diameter of the positioning hole.

\* \* \* \* \*